United States Patent
Do et al.

(10) Patent No.: US 11,227,655 B2
(45) Date of Patent: Jan. 18, 2022

(54) SEMICONDUCTOR MEMORY DEVICE INCLUDING A CONTROL CIRCUIT FOR CONTROLLING A READ OPERATION

(71) Applicants: SK hynix Inc., Icheon (KR); Seoul National University R&DB Foundation, Seoul (KR)

(72) Inventors: Hyungrok Do, Seoul (KR); Hong Seok Choi, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/452,325

(22) Filed: Jun. 25, 2019

(65) Prior Publication Data

US 2020/0013459 A1  Jan. 9, 2020

(30) Foreign Application Priority Data

Jul. 9, 2018 (KR) .......................... 10-2018-0079296

(51) Int. Cl.
*G11C 13/00* (2006.01)

(52) U.S. Cl.
CPC ........ *G11C 13/004* (2013.01); *G11C 13/0004* (2013.01); *G11C 13/0026* (2013.01); *G11C 13/0028* (2013.01); *G11C 2213/15* (2013.01)

(58) Field of Classification Search
CPC .............. G11C 13/004; G11C 13/0026; G11C 13/0028
USPC ........................................................ 365/163
See application file for complete search history.

(56) References Cited

U.S. PATENT DOCUMENTS

| 7,876,607 | B2 | 1/2011 | Tang |
| 8,681,540 | B2 | 3/2014 | Zeng |
| 9,025,386 | B1* | 5/2015 | Iyer ........................ G11C 16/26 365/185.18 |
| 9,165,647 | B1* | 10/2015 | Guliani ............... G11C 11/1655 |
| 9,286,975 | B2 | 3/2016 | Chu et al. |
| 9,478,286 | B1 | 10/2016 | Mantegazza et al. |
| 9,543,004 | B1 | 1/2017 | Ly-Gagnon et al. |
| 9,685,204 | B2 | 6/2017 | Taub et al. |
| 2007/0030741 | A1* | 2/2007 | Nii .......................... G11C 8/08 365/189.11 |
| 2010/0271862 | A1* | 10/2010 | Yoon ................... G11C 11/1673 365/148 |
| 2014/0169089 | A1* | 6/2014 | Castro ................ G11C 13/0038 365/163 |
| 2015/0243355 | A1* | 8/2015 | Lee ..................... G11C 13/0069 365/148 |
| 2017/0345509 | A1* | 11/2017 | Tran ......................... G11C 7/14 |
| 2018/0059938 | A1* | 3/2018 | Kang .................. G11C 11/1655 |
| 2018/0316324 | A1* | 11/2018 | Saxena ................... G11C 16/30 |

FOREIGN PATENT DOCUMENTS

KR       100498493 B1       7/2005

* cited by examiner

*Primary Examiner* — Anthan Tran

(57) ABSTRACT

A semiconductor memory device includes a memory cell array including one or more memory cells each coupled between a wordline and a bitline, a sense amplifier configured to amplify a voltage of a global wordline, a wordline decoder including a plurality of wordline switches coupling the wordline and the global wordline, and a control circuit configured to control the wordline decoder and the sense amplifier.

19 Claims, 11 Drawing Sheets

SEMICONDUCTOR MEMORY DEVICE INCLUDING A CONTROL CIRCUIT FOR CONTROLLING A READ OPERATION

CROSS-REFERENCE TO RELATED APPLICATION

The present application claims priority under 35 U.S.C. § 119(a) to Korean Patent Application No. 10-2018-0079296, filed on Jul. 9, 2018, which are incorporated herein by reference in its entirety.

BACKGROUND

1. Technical Field

Various embodiments may relate to a semiconductor memory device including a control circuit for controlling a read operation.

2. Related Art

A phase change memory (PCM) device using a material having resistance characteristics that vary depending on its crystal structure is being developed.

For example, the resistance value of a cell in a crystalline state is smaller than the resistance value of the cell in an amorphous state.

FIG. 1 illustrates a read operation of a phase change memory device.

In FIG. 1, the horizontal axis represents a voltage across a memory cell and the vertical axis represents a current (or a cell current) flowing through the memory cell that includes a phase change material.

A read voltage $V_{READ}$ that is higher than a set threshold voltage $V_{th,\,SET}$ and lower than a reset threshold voltage $V_{th,\,RST}$ is provided in the reading operation.

For example, the read voltage $V_{READ}$ is a voltage across the memory cell.

When the phase change material is in an amorphous state, the cell current increases along lines (2) and (4) as the cell voltage increases, and thus remains lower than a threshold current $I_{th}$ when the cell voltage reaches the read voltage $V_{READ}$.

If the phase change material is in a crystalline state, the cell current increases along lines (2) and (3) as the cell voltage increases, a snapback phenomenon (or snapback) occurs after reaching the threshold current $I_{th}$, and then the cell current increase rapidly along line (1).

The reciprocal of the slope of line (1) corresponds to the on resistance of the phase change material.

When the phase change material is in the crystalline state, a relatively large cell current flows after the snapback. Such a large cell current causes heat generation, and the crystal structure of the phase change material may change.

When read operations are repeatedly performed on the memory cell including the phase change material, the crystal structure of the phase change material may be changed, thereby resulting in a read disturbance issue.

SUMMARY

In accordance with an embodiment of the present disclosure, a semiconductor device may include a memory cell array including one or more memory cells each coupled between a wordline and a bitline; a sense amplifier configured to amplify a voltage of a global wordline; a wordline decoder including a plurality of wordline switches coupling the wordline and the global wordline; and a control circuit configured to control the wordline decoder and the sense amplifier.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 2:
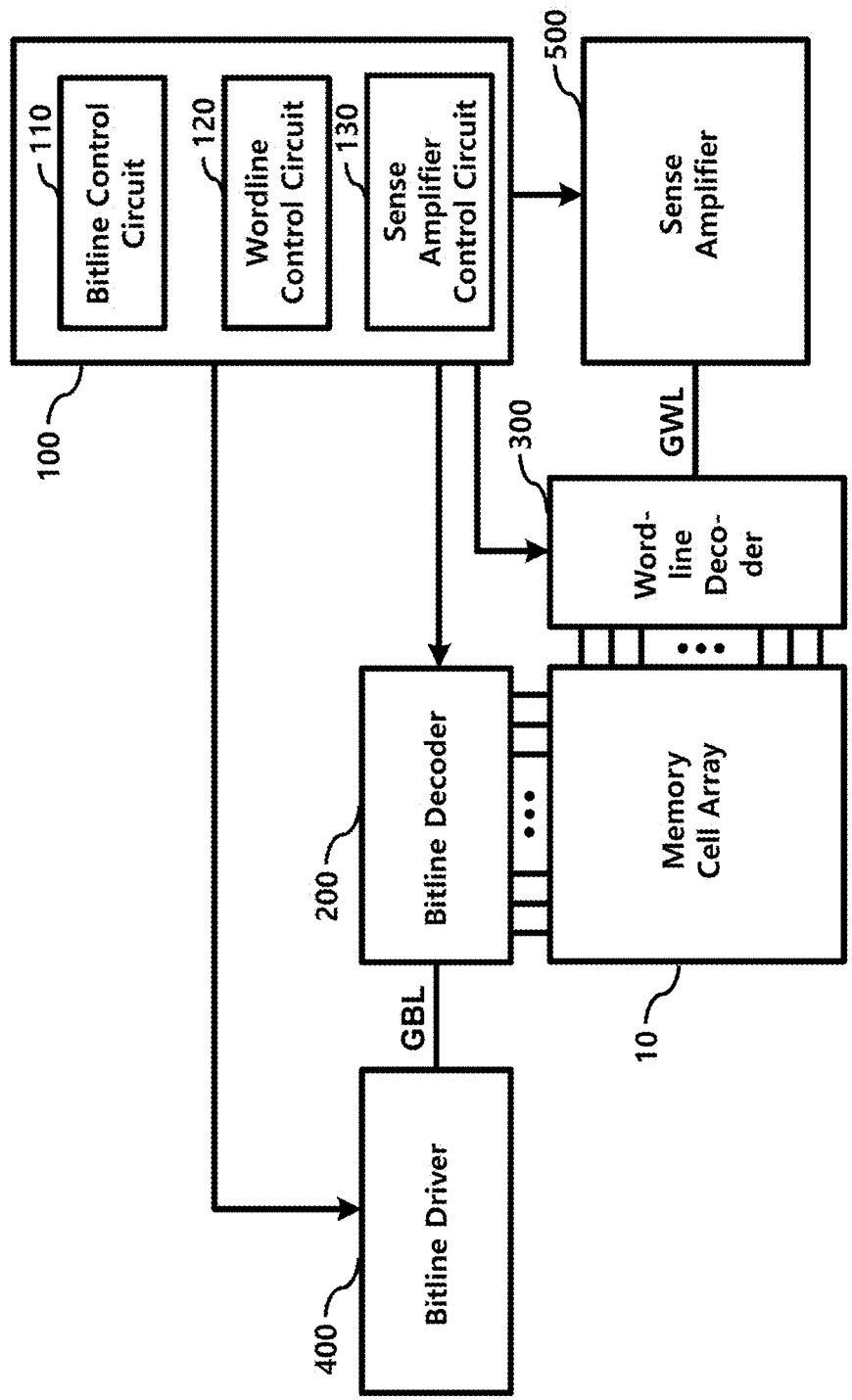
FIG. 2 illustrates a semiconductor memory device according to an embodiment of the present disclosure.

FIG. 2 illustrates a semiconductor memory device according to an embodiment of the present disclosure.

A semiconductor memory device according to an embodiment of the present disclosure includes a memory cell array 10, a control circuit 100, a bitline decoder 200, a wordline decoder 300, a bitline driver 400, and a sense amplifier 500.

In the embodiment shown in FIG. 2, the memory cell array 10 includes a plurality of memory cells. For example, a memory cell may be a memory cell including a phase change material, but embodiments of the present disclosure are not limited thereto. In an embodiment, the plurality of memory cells comprise of the same memory types. In another embodiment, the plurality of memory cells do not comprise of the same memory types.

The control circuit 100 includes a bitline control circuit 110 for controlling the bitline decoder 200 and the bitline driver 400, a wordline control circuit 120 for controlling the wordline decoder 300, and a sense amplifier control circuit 130 for controlling the sense amplifiers 500.

Figure 3:
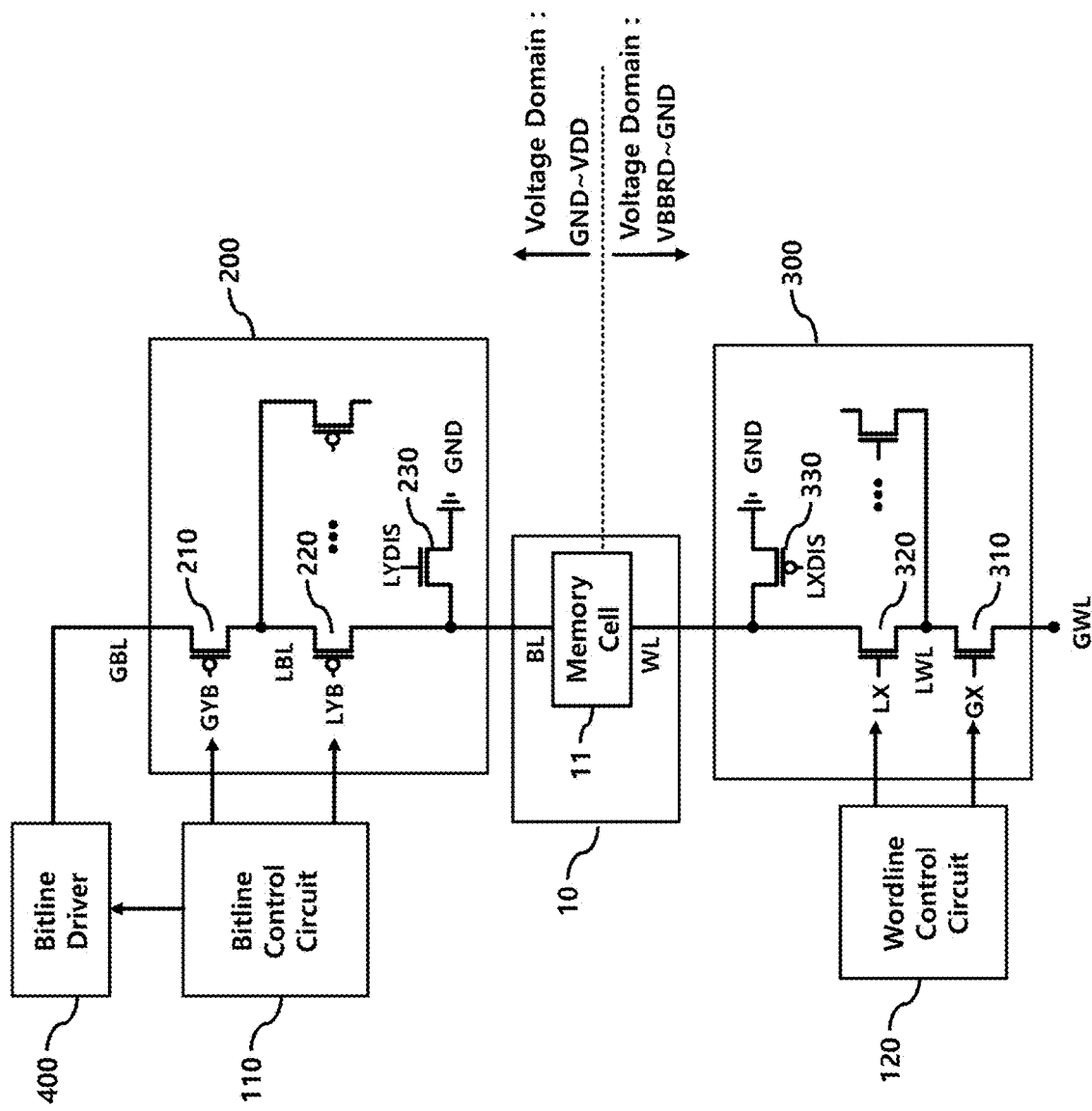
FIG. 3 illustrates a bitline decoder and a wordline decoder according to an embodiment of the present disclosure.

In an embodiment, the semiconductor memory device may have a hierarchical bitline structure including a high-level global bitline GBL and a low-level local bitline (e.g., a local bitline LBL in FIG. 3).

The bitline driver 400 controls the voltage of the global bitline GBL.

The bitline decoder 200 controls switches for coupling the global bitline GBL to the local bit line and coupling the local bit line to a bitline to which a memory cell is coupled.

In an embodiment, the semiconductor memory device may have a hierarchical wordline structure including a high-level global wordline GWL and a low-level local wordline (e.g., a local wordline LWL in FIG. 3).

The wordline decoder 300 controls switches for coupling the local wordline to the global wordline GWL and coupling the local wordline LWL to a wordline to which a memory cell is coupled.

The sense amplifier 500 amplifies the voltage of the global wordline GWL and outputs a signal indicating a state of the memory cell.

FIG. 3 illustrates a bitline decoder 200 and a wordline decoder 300 according to an embodiment of the present disclosure.

The cell array 10 includes a plurality of memory cells 11 and each memory cell 11 is connected between a bitline BL and a wordline WL. Only a single memory cell 11 selected among the plurality of memory cells 11 is shown in FIG. 3 for the interest of brevity.

The bitline decoder 200 includes a global bitline switch 210 and a local bitline switch 220. The bitline decoder 200 may further include a bitline discharge switch 230.

The bitline control circuit 110 controls the bitline driver 400 to control the voltage of the global bitline GBL in a read operation.

The bitline control circuit 110 controls the global bitline switch 210 according to a global bitline control signal GYB to couple a global bitline GBL to a local bitline LBL.

The bitline control circuit 110 controls the local bitline switch 220 according to a local bitline control signal LYB to couple the local bitline LBL to the bitline BL.

The bitline control circuit 110 may control the bitline discharge switch 230 according to a bitline discharge control signal LYDIS to ground the bitline BL.

The global bitline switch 210 is a transistor (e.g., a PMOS transistor) having a control terminal (e.g., a gate) to which the global bitline control signal GYB is applied and having a first terminal (e.g., a source) coupled to the global bitline GBL and a second terminal (e.g., a drain) coupled to the local bitline LBL.

The local bitline switch 220 is a PMOS transistor having a gate to which the local bitline control signal LYB is applied and having a source coupled to the local bitline LBL and a drain coupled to the bitline BL.

In an embodiment, the bitline discharge switch 230 is a transistor (e.g., an NMOS transistor) having a control terminal (e.g., a gate) to which the bitline discharge control signal LYDIS is applied and being coupled between the bitline BL and the ground voltage GND.

The wordline decoder 300 includes a global wordline switch 310 and a local wordline switch 320. The wordline decoder 300 may further include a wordline discharge switch 330.

The wordline control circuit 120 controls the global wordline switch 310 according to a global wordline control signal GX to couple the global wordline GWL to the local wordline LWL.

The wordline control circuit 120 controls the local wordline switch 320 in response with a local wordline control signal LX to couple the local wordline LWL to the wordline WL.

The wordline control circuit 120 may control the wordline discharge switch 330 in response with a wordline discharge control signal LXDIS to ground the wordline WL.

In an embodiment, the global wordline switch 310 is a transistor (e.g., an NMOS transistor) having a control terminal (e.g., a gate) to which the global wordline control signal GX is applied and having a first terminal (e.g., a source) coupled to the global wordline GWL and a second terminal (e.g., a drain) coupled to the local wordline LWL.

In an embodiment, the local wordline switch 320 is an NMOS transistor having a gate to which the local wordline control signal LX is applied and having a source coupled to the local wordline LWL and a drain coupled to the wordline WL.

The wordline discharge switch 330 is a transistor (e.g., a PMOS transistor) having a control terminal (e.g., a gate) to which wordline discharge control signal LXDIS is applied and being coupled between the wordline WL and the ground voltage GND.

In the embodiment of FIG. 3, a portion above the memory cell 11 operates in a first voltage domain ranging from the ground voltage GND to a positive power supply voltage VDD and a portion under the memory cell 11 operates in a second voltage domain ranging from a negative power supply voltage VBBRD to the ground voltage GND.

Hereinafter, the positive power supply voltage VDD may be referred to as a positive voltage, and the negative power supply voltage VBBRD may be referred to as a negative voltage.

The voltages of the global bitline GBL, the local bitline LBL and control signals used in the portion above the memory cell 11 vary between the positive voltage VDD, which corresponds to a first level (e.g., a high level), and the ground voltage GND, which corresponds to a second level (e.g., a low level). For example, the control signals used in the portion above the memory cell 11 include one or more of the global bitline control signal GYB, the local bitline control signal LYB, and the bitline discharge control signal LYDIS.

One or more of the voltages of the local wordline LWL and global wordline GWL, control signals, and supply voltages used in the portion below the memory cell 11 vary between the ground voltage GND, which corresponds to a first level (e.g., a high level), and the negative voltage VBBRD, which corresponds to a second level (e.g., a low level). For example, the control signals and supply voltages used in the portion below the memory cell 11 include control signals and supply voltages, which are provided to a sense amplifier (e.g., the sense amplifier 500 of FIG. 1) or used in the sense amplifier.

Referring back to FIG. 1, the control circuit 100 operates to reduce a time interval during which a current flows through a memory cell 11 in the set state in the read operation, thereby substantially addressing the read disturbance issue. For example, the control circuit 100 may reduce a time interval during which the current has a magnitude large enough to damage the memory cell 11, thereby substantially preventing the read disturbance. In this case, a signal (e.g., voltage) of the global wordline GWL may have a relatively small value.

The control circuit 100 performs a control operation of the sense amplifier 500 for effectively sensing and amplifying the signal of the global wordline GWL that has such a small value.

An operation of the control circuit 100 will be described below in more detail.

Figure 4:
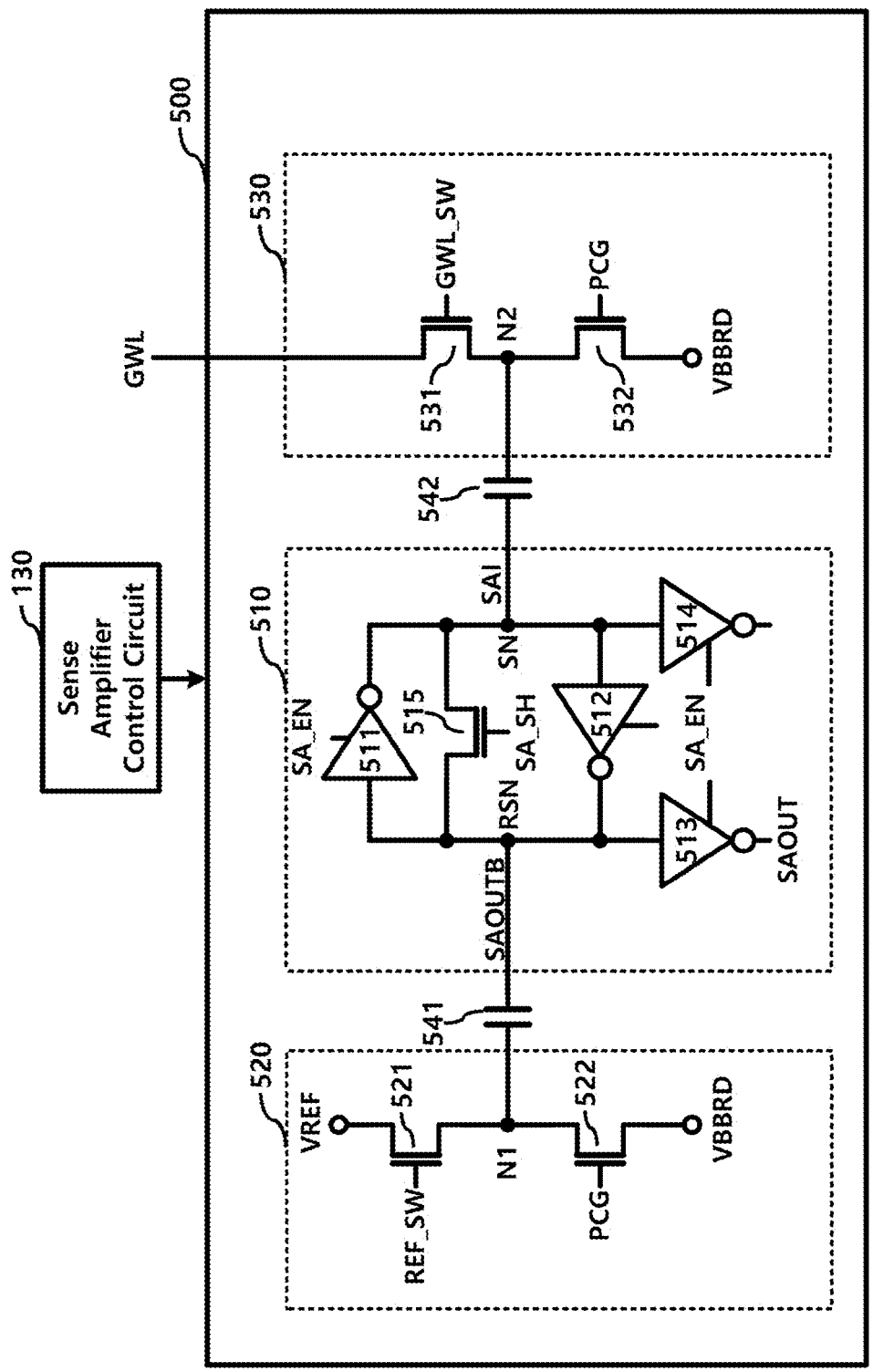
FIG. 4 illustrates a sense amplifier according to a first embodiment of the present disclosure.

FIG. 4 illustrates a sense amplifier 500 according to an embodiment of the present disclosure.

The sense amplifier 500 is controlled by a sense amplifier control circuit (e.g., the sense amplifier control circuit 130 of FIG. 2) to amplify a signal (e.g., a voltage) of the global wordline GWL and output a digital signal indicative of data stored in a memory cell (e.g., the memory cell 11 of FIG. 3). In an embodiment, the sense amplifier 500 may use a reference voltage VREF.

The sense amplifier 500 includes a signal amplification circuit 510, a reference signal input circuit 520, and a signal input circuit 530.

The signal amplification circuit 510 includes a first inverter 511 and a second inverter 512 that function as a latch, and the first and second inverters 511 and 512 are coupled between a reference signal input node RSN and a signal input node SN.

The signal amplification circuit 510 further includes a third inverter 513 for inverting a signal SAOUTB at the reference signal input node RSN and a fourth inverter 514 for inverting a signal SAI at the signal input node SN.

Each of the first to fourth inverters 511 to 514 inverts the input signal thereof when a control signal SA_EN is activated and outputs a signal indicating a high impedance state when the control signal SA_EN is inactivated.

When the control signal SA_EN is activated, the signal SAI at the signal input node SN has the same logic level as the output signal SAOUT of the third inverter 513, and the signal SAOUTB at the reference signal input node RSN has the same logic level as the output signal of the fourth inverter 514.

The signal amplification circuit 510 includes an initialization switch 515.

In an embodiment, the initialization switch 515 is a transistor (e.g., an NMOS transistor) having a control terminal (e.g., a gate) receiving a control signal SA_SH controlled by the sense amplifier control circuit 130 and being coupled between the signal input node SN and the reference signal input node RSN.

For example, when the control signal SA_SH is activated, the voltages of the signal input node SN and the reference signal input node RSN are initialized to a half voltage of a power supply voltage for driving the first inverter 511 and the second inverter 512.

When the control signal SA_SH is inactivated, the first inverter 511 and the second inverter 512 amplify a voltage difference between the signal input node SN and the reference signal input node RSN.

The reference signal input circuit 520 provides either the reference voltage VREF or the negative voltage VBBRD to a reference signal output node N1 in response to control signals REF_SW and PCG.

The reference signal input circuit 520 includes a reference voltage output switch 521 for outputting the reference voltage VREF according to the control signal REF_SW, and a first precharge switch 522 for outputting the negative voltage VBBRD according to the control signal PCG.

In an embodiment, the reference voltage output switch 521 is a transistor (e.g., an NMOS transistor) having a control terminal (e.g., a gate) to which a control signal REF_SW is applied, and being coupled between the reference signal output node N1 and the reference voltage VREF.

In an embodiment, the first precharge switch 522 is a transistor (e.g., an NMOS transistor) having a control terminal (e.g., a gate) to which a control signal PCG is applied, and being coupled between the reference signal output node N1 and a negative voltage VBBRD.

The signal input circuit 530 provides either the voltage of the global wordline GWL or the negative voltage VBBRD to the signal output node N2 according to control signals GWL_SW and PCG.

The signal input circuit 530 includes a global wordline connection switch 531 for outputting the voltage the global wordline GWL according to the control signal GWL_SW, and a second precharge switch 532 for outputting the negative voltage VBBRD according to the control signal PCG.

In an embodiment, the global wordline connection switch 531 is a transistor (e.g., an NMOS transistor) having a control terminal (e.g., a gate) to which a control signal GWL_SW is applied and being coupled between the signal output node N2 and the global wordline GWL.

In an embodiment, the second precharge switch 532 is a transistor (e.g., an NMOS transistor) having a control terminal (e.g., a gate) to which the control signal PCG is applied, and being coupled between the signal output node N2 and the negative voltage VBBRD.

The sense amplifier 500 includes a first coupling capacitor 541 and a second coupling capacitor 542.

The first coupling capacitor 541 is coupled between the reference signal output node N1 and the reference signal input node RSN, and the second coupling capacitor 542 is coupled between the signal output node N2 and the signal input node SN.

Figure 5:
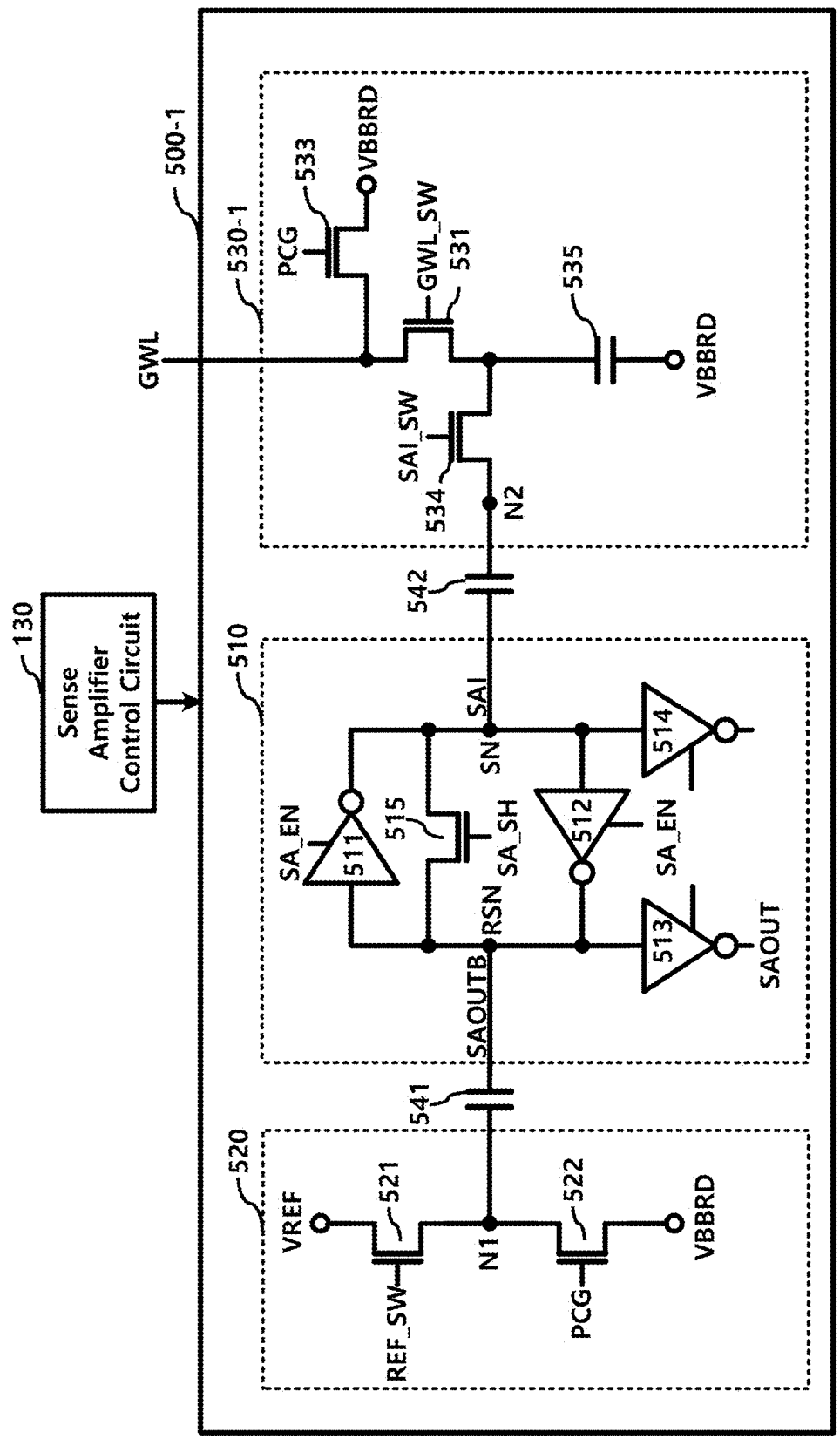
FIG. 5 illustrates a sense amplifier according to a second embodiment of the present disclosure.

FIG. 5 illustrates a sense amplifier 500-1 according to an embodiment of the present disclosure.

The embodiment of FIG. 5 has substantially the same configuration as the embodiment of FIG. 4 except for the detailed configuration of the signal input circuit 530-1.

Hereinafter, only the detailed configuration of the signal input circuit 530-1 will be described for the interest of brevity.

The signal input circuit 530-1 includes a capacitor 535 and a global wordline connection switch 531 that couples the global wordline GWL and a first end of the capacitor 535 in accordance with a control signal GWL_SW.

In an embodiment, the global wordline connection switch 531 is a transistor (e.g., an NMOS transistor) having a control terminal (e.g., a gate) to which a control signal GWL_SW is applied and being coupled between the global wordline GWL and the first end of the capacitor 535.

A second end of the capacitor 535 is coupled to a negative voltage VBBRD.

The signal input circuit 530-1 further includes a third precharge switch 533 that couples the global wordline GWL and the negative voltage VBBRD according to the control signal PCG.

In an present embodiment, the third precharge switch 533 is a transistor (e.g., an NMOS transistor) having a control terminal (e.g., a gate) that receives the control signal PCG and being coupled between the global wordline GWL and the negative voltage VBBRD.

The signal input circuit 530-1 further includes a signal output switch 534 that couples the first end of the capacitor 535 and the signal output node N2 according to a control signal SAI_SW.

In an embodiment, the signal output switch 534 is a transistor (e.g., an NMOS transistor) having a control terminal (e.g., a gate) to which a control signal SAI_SW is applied and being coupled between the signal output node N2 and the first end of the capacitor 535.

Figure 6:
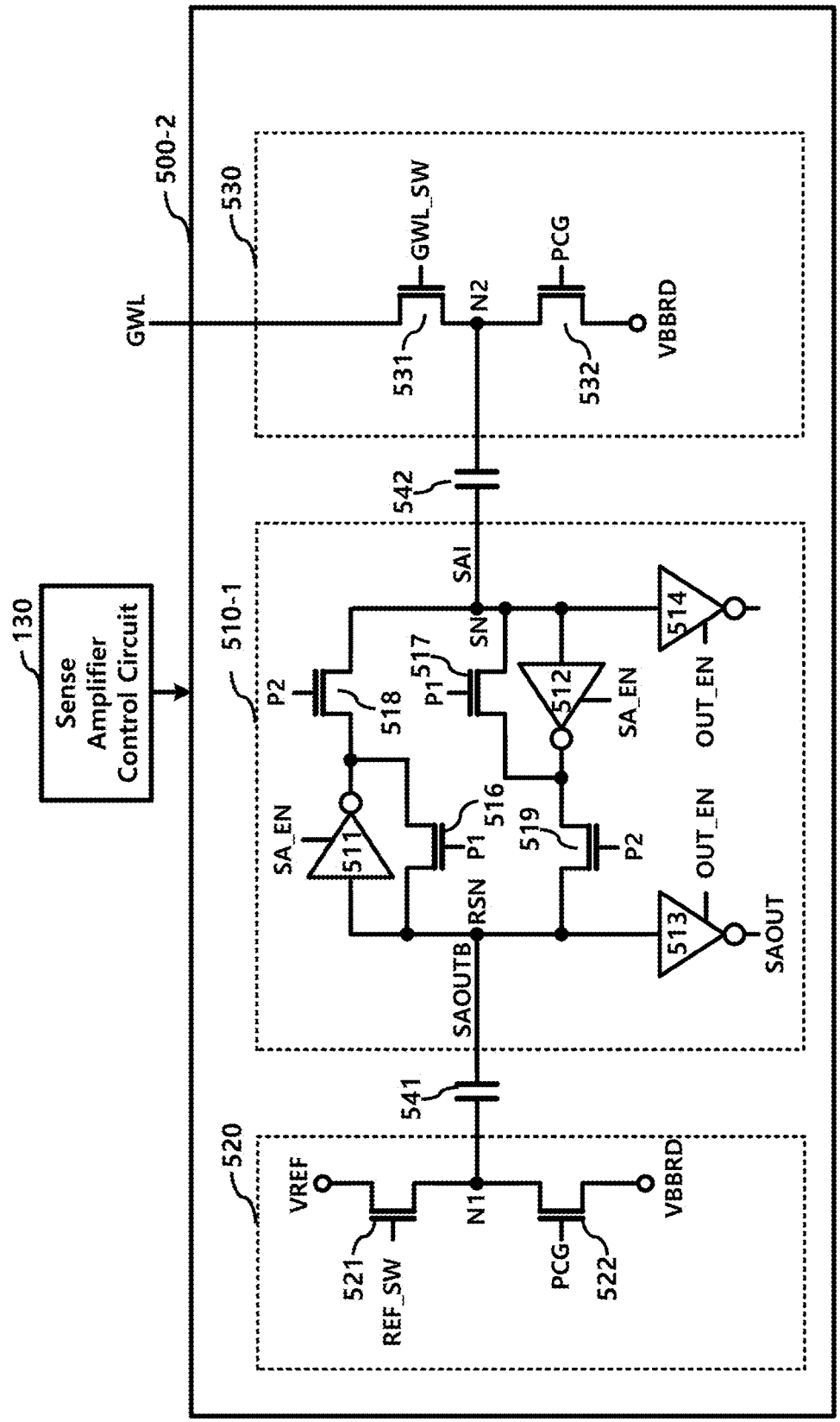
FIG. 6 illustrates a sense amplifier according to a third embodiment of the present disclosure.

FIG. 6 illustrates a sense amplifier 500-2 according to an embodiment of the present disclosure.

The embodiment of FIG. 6 has substantially the same configuration as the embodiment of FIG. 4 except for the detailed configuration of the signal amplification circuit 510-1.

Hereinafter, only the detailed configuration of the signal amplification circuit 510-1 will be described for the interest of brevity.

The signal amplification circuit 510-1 includes a first inverter 511 and a second inverter 512 functioning as a latch.

The first and second inverters 511 and 512 perform an inversion operation when the control signal SA_EN is activated and enter a high impedance state when the control signal SA_EN is inactivated.

An input terminal of the first inverter 511 is coupled to a reference signal input node RSN.

The signal amplification circuit 510-1 further includes a first switch 516 for coupling the input node and an output node of the first inverter 511 according to a first control signal P1, and includes a second switch 518 for coupling the output node of the first inverter 511 and a signal input node SN according to a second control signal P2.

An input node of the second inverter 512 is coupled to the signal input node SN.

The signal amplification circuit 510-1 further includes a third switch 517 for coupling the input node and an output node of the second inverter 512 according to the first control signal P1, and includes a fourth switch 519 for coupling the output node of the second inverter 512 and the reference signal input node RSN according to the second control signal P2.

In an embodiment, the first, second, third, and fourth switches 516, 517, 518, and 519 are transistors (e.g., NMOS transistors) each having a control terminal (e.g., a gate) to which a corresponding control signal P1 or P2 is applied.

The signal amplification circuit 510-1 further includes a third inverter 513 for inverting a signal at the reference signal input node RSN and a fourth inverter 514 for inverting a signal at the signal input node SN.

In an embodiment, a control signal OUT_EN for controlling activation of the third and fourth inverters 513 and 514 is different from the control signal SA_EN for controlling activation of the first and second inverters 511 and 512.

Figure 7:
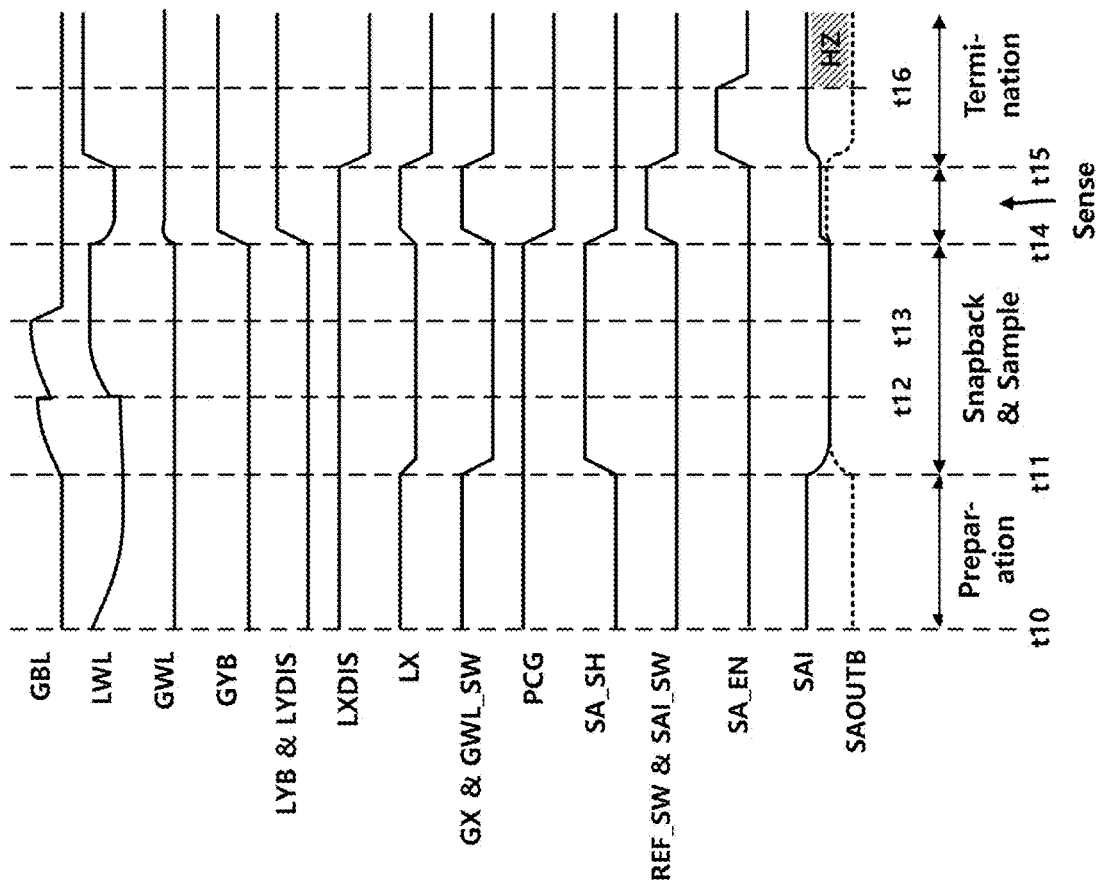
FIGS. 7 and 8 illustrate operations of a control circuit that includes a sense amplifier suitable for use as the sense amplifier in FIG. 4 or FIG. 5 when a memory cell is first and second states, respectively, according to an embodiment of the present disclosure.
Figure 8:
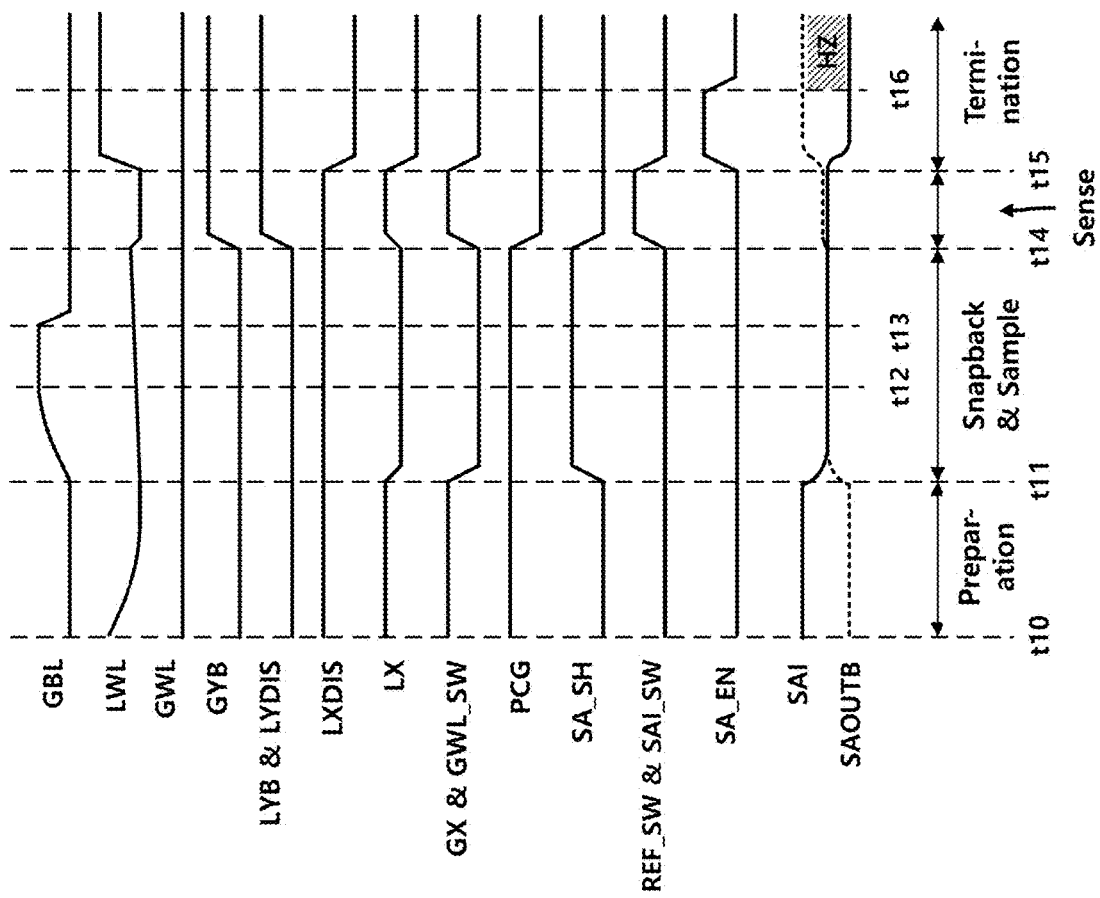

FIGS. 7 and 8 each illustrate an operation of a control circuit (e.g., the control circuit 100 of FIG. 2) that includes a sense amplifier (e.g., the sense amplifier 500 of FIG. 4 or the sense amplifier 500-1 of FIG. 5), according to an embodiment.

The sense amplifier 500 shown in FIG. 4 operates substantially as same as the sense amplifier 500-1 shown in FIG. 5 except using the control signal SAI_SW.

In the timing diagrams of FIGS. 7 and 8, the high level and the low level follow the voltage domain rule described with reference to FIG. 3.

For example, a first low level corresponds to the ground voltage GND and a first high level corresponds to the power supply voltage VDD for the voltage of the global bitline GBL, while a second low level corresponds to the negative voltage VBBRD and a second high level corresponds to the ground voltage GND for the voltage of the global wordline GWL.

FIG. 7 illustrates an operation of a control circuit (e.g., the control circuit 100 of FIG. 2) including a memory cell (e.g., the memory cell 11 in FIG. 3) is programmed to a first state (e.g., a set state or a crystalline state) according to an embodiment.

The section (or a first time interval) between a first time t10 to a second time t11 is referred to as a preparation stage.

In the preparation stage, the selected memory cell 11 is connected with the global bitline GBL and the global wordline GWL before initiating the read operation.

In the preparation stage, the voltage of the global bitline GBL is initialized to a first level (e.g., a low level).

Referring to FIGS. 3 and 4, the bitline control circuit 110 sets the global bitline control signal GYB and the local bitline control signal LYB to a low level and the wordline control circuit 120 sets the local wordline control signal LX and the global wordline control signal GX to a second level (e.g., a high level).

Thus, a current path is formed between the global bitline GBL and the global wordline GWL via the selected memory cell 11.

The bitline control circuit 110 sets each of the bitline discharge control signal LYDIS to a low level and the wordline control circuit 120 sets each of the wordline discharge control signal LXDIS to a high level, and thus both the bitline discharge switch 230 and the wordline discharge switch 330 are turned off.

The bitline control circuit 110 and the wordline control circuit 120 turn off the remaining bitline discharge switches and wordline discharge switches corresponding to unselected memory cells to make both nodes of each of the unselected memory cells be grounded.

In the preparation stage, the sense amplifier control circuit 130 sets each of the control signals GWL_SW and PCG to a high level and sets each of the control signals SA_SH, SA_EN, REF_SW and SAI_SW to a low level.

As a result, the switches 531 and 532 are turned on and the global wordline GWL is initialized to the negative voltage VBBRD.

The local wordline LWL is initialized to the ground voltage due to the wordline WL which is initialized to the ground voltage. The local wordline LWL is gradually pulled down to the negative voltage VBBRD due to the global wordline GWL which is pulled down to the negative voltage VBBRD.

The first and second precharge switches 522 and 532 are turned on in the sense amplifier 500 of FIG. 4 and the voltages of the reference signal output node N1 and the signal output node N2 are initialized to the negative voltage VBBRD.

Referring to FIG. 5, the first precharge switch 522 is turned on in the sense amplifier 500-1 of FIG. 5, and the voltage of the reference signal output node N1 is initialized to the negative voltage VBBRD.

The third precharge switch 533 and the global wordline connection switch 531 are turned on so that the voltages of both nodes of the capacitor 535 becomes substantially equal to the negative voltage VBBRD.

Figure 1:
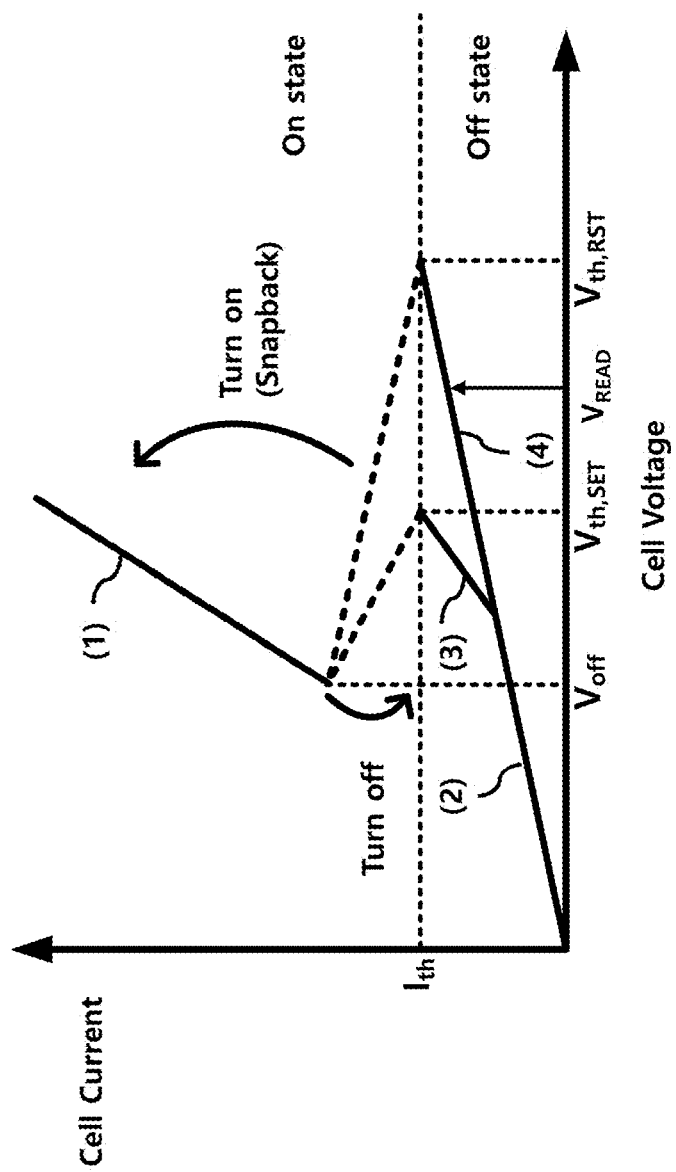
FIG. 1 illustrates a read operation of a semiconductor memory device.

The voltages of the signal input node SN and the reference signal input node RSN of the sense amplifier 500 of FIG. 4 or 500-1 of FIG. 5 may vary in the preparation stage.

For example, in the embodiment of FIG. 7, the voltage of the signal input node SN has a high level and the voltage of the reference signal input node RSN has aa low level.

As described above, in the preparation stage, the voltages of the global wordline GWL and the local wordline LWL are lowered to the negative voltage VBBRD to prepare for the read operation.

The section (or a second time interval) between the second time t11 and a fifth time t14 is referred to as a snapback and sample stage.

At the second time t11, the wordline control circuit 120 controls the local wordline control signal LX to have a value (e.g., an intermediate voltage) between a high level and a low level and controls the global wordline control signal GX and the control signal GWL_SW to have a voltage of a low level. For example, the intermediate voltage of the local wordline control signal LX may be determined based on a trade-off between decreasing degree of damage to the memory cell and ensuring a margin of the reference voltage VREF.

As a result, the local wordline LWL is separated from the global wordline GWL while the local wordline LWL is at the negative voltage VBBRD, and the global wordline GWL is separated from the sense amplifier 500 while the global wordline GWL is at the negative voltage VBBRD. For example, the local wordline LWL is electrically decoupled from the global wordline GWL because the global wordline switch 310 is turned off in response to the global wordline control signal GX, and the global wordline GWL is electrically decoupled from the sense amplifier 500 because the global wordline connection switch 531 is turned off in response to the control signal GWL_SW.

At this time, an on-resistance value of the local wordline switch 320 of FIG. 3 is controlled to have a larger value than that of the local wordline switch 320 in the fully turned-on state.

In the second time interval, the bitline control circuit 110 controls the bitline driver 400 to gradually increase the voltage of the global bitline GBL.

A section between the second time t11 and a third time t12 corresponds to a section in which a cell current increases along a first given path (e.g., lines (2) and (3) of FIG. 1). The third time t12 corresponds to the point at which snapback occurs and the cell current starts to increase along a second given path (e.g., the line (4) of FIG. 1).

As a result, discontinuity of the cell current occurs at the third time t12, and thus the voltage of the global bitline GBL decreases discontinuously and the voltage of the local wordline LWL increases discontinuously.

Thereafter, the voltage of the local wordline LWL gradually increases and saturates at the ground voltage when the voltage of the global bitline GBL gradually increases.

At a fourth time t13, the bitline control circuit 110 controls the bitline driver 400 to drive the voltage of the global bitline GBL to a low level, for example, the ground voltage GND.

The control signal SA_SH is set to a high level between the second time t11 and a fifth time t14 and the signal input node SN and the reference signal input node RSN are initialized to an intermediate voltage between the ground voltage GND and the negative voltage VBBRD.

As described above, the snapback and sample stage sets the voltage of the local wordline LWL according to the state of the memory cell 11.

For example, the voltage of the local wordline LWL is set to a high level when the memory cell 11 is in the set state as shown in FIG. 7. The voltage of the local wordline LWL is substantially kept at a low level when the memory cell 11 is in the reset state as shown in FIG. 8. For example, although the voltage of the local wordline LWL is slightly increased as the cell voltage increases in the second time interval t11 to t14, the increased amount of the voltage of the local wordline LWL is sufficiently small that the voltage of the local wordline LWL remains at a low level.

The section (or a third time interval) between a fifth time t14 and a sixth time t15 is referred to as a sensing stage where the voltage of the local wordline LWL is provided to the sense amplifier 500 via the global wordline GWL.

The global bitline control signal GYB, the local bitline control signal LYB, and the bitline discharge signal LYDIS each are controlled to be at a high level at the fifth time t14.

At the fifth time t14, the local wordline control signal LX and the global wordline control signal GX each are controlled to be at a high level.

Since the voltage of the global wordline GWL is at a low level, for example, the negative voltage VBBRD and the voltage of the local wordline LWL is at a high level, for example, the ground voltage GND, the voltage of the local wordline LWL decreases and the voltage of the wordline GWL increases after the fifth time t14.

For example, the increase in the voltage of the global wordline GWL is smaller than the decrease in the voltage of the local wordline LWL due to the difference between the parasitic capacitance of the local wordline LWL and the parasitic capacitance of the global wordline GWL. When the voltage of the local wordline LWL starts to decrease at the fifth time t14, the voltage of the global bitline GBL has been deasserted to have a low level since the fourth time t13 and the voltage of the bitline BL coupled to the selected memory cell 11 has been decreased too since the fourth time t13. As a result, although the voltage of the wordline WL is decreased with the decrease in the voltage of the local wordline LWL, the cell voltage between the bitline BL and the wordline WL is kept sufficiently small to substantially prevent another occurrence of snapback in the memory cell.

The control signals GWL_SW, REF_SW, and SAI_SW provided to the sense amplifier each are controlled to be at a high level, and the control signals PCG, SA_SH, and SA_EN each are controlled to be at a low level.

The voltage of the reference signal input node RSN is increased by the reference voltage VREF and the voltage charged in the first coupling capacitor 541. The voltage of the signal input node SN is increased by the voltage of the global wordline GWL and the voltage charged in the second coupling capacitor 542.

For example, the reference voltage VREF has a given value between the negative voltage VBBRD and the voltage of the global wordline GWL.

Accordingly, a slight difference between the voltage SAI at the signal input node SN of the signal amplification circuit 510 and the voltage SAOUTB at the reference signal input node RSN exists in the third time interval between the fifth time t14 and a sixth time t15. For example, the voltage SAI at the signal input node SN is slightly greater than the voltage SAOUTB at the reference signal input node RSN, as shown in FIG. 7.

The section (or a fourth time interval) after the sixth time t15 is referred to as a termination stage.

At the sixth time t15, the local bitline control signal LX, the global bitline control signal GX and the wordline discharge control signal LXDIS each are controlled to be at a low level.

The control signals GWL_SW and SAI_SW each are also controlled to be at a low level.

As a result, the memory cell 11 is separated (or electrically decoupled) from the local wordline LWL and the wordline WL is set to a ground voltage.

Also, the local wordline LWL is separated (or electrically decoupled) from the global wordline GWL, and the global wordline GWL is separated (or electrically decoupled) from the sense amplifier 500.

The control signal SA_EN is set to be at a high level between the sixth time t15 and a seventh time t16 so that the first and the second inverters 511 and 512 that function as a latch in the sense amplifier 500 operate. As a result, a voltage difference between the signal input node SN and the reference signal input node RSN is amplified and the third and fourth inverters 513 and 514 output the amplified signal.

When the control signal SA_EN is set to be at a low level at the seventh time t16, the output of the sense amplifier 500 or 500-1 indicates a high impedance state HZ.

FIG. 8 illustrates an operation of a control circuit (e.g., the control circuit 100 of FIG. 2) including a memory cell (e.g., the memory cell 11 in FIG. 3) is programmed to a second state (e.g., a reset state or an amorphous state) according to an embodiment.

The snapback does not occur in the embodiment shown in FIG. 8.

Accordingly, even if the voltage of the global bitline GBL is increased between the second time t11 and the third time t12, the current flowing through the memory cell 11 increases slowly along a given path (e.g., lines (2) and (4) of FIG. 1).

Therefore, the voltage of the local wordline LWL also increases slowly in the second time interval between the second time t11 and the fifth time t14.

The voltage of the global wordline GWL hardly rises and the voltage of the local wordline LWL decreases to a level substantially equal to the negative voltage VBBRD after the local wordline LWL is connected to the global wordline GWL at the fifth time t14.

At this time, the voltage of the reference voltage VREF becomes higher than the voltage of the global wordline GWL. In an embodiment, the reference voltage VREF is predetermined such that a difference between the voltage SAOUTB at the reference signal input node RSN and the voltage SAI at the signal input node SN is sufficiently large to be detected by the sense amplifier 500.

Accordingly, the sense amplifier 500 outputs a signal opposite to that in FIG. 7 in a portion of the fourth time interval between the sixth time t15 and the seventh time t16.

Figure 9:
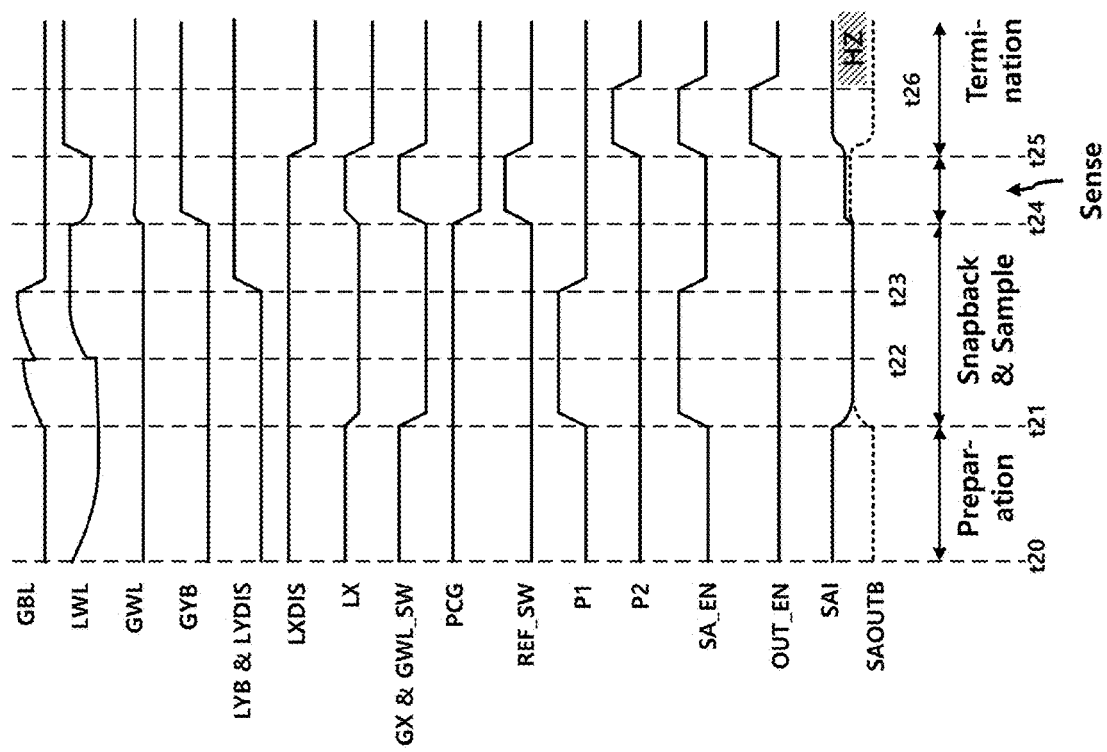
FIGS. 9 and 10 illustrate operations of a control circuit that includes a sense amplifier suitable for use as the sense amplifier of FIG. 6 when a memory cell is first and second states, respectively, according to an embodiment of the present disclosure.
Figure 10:
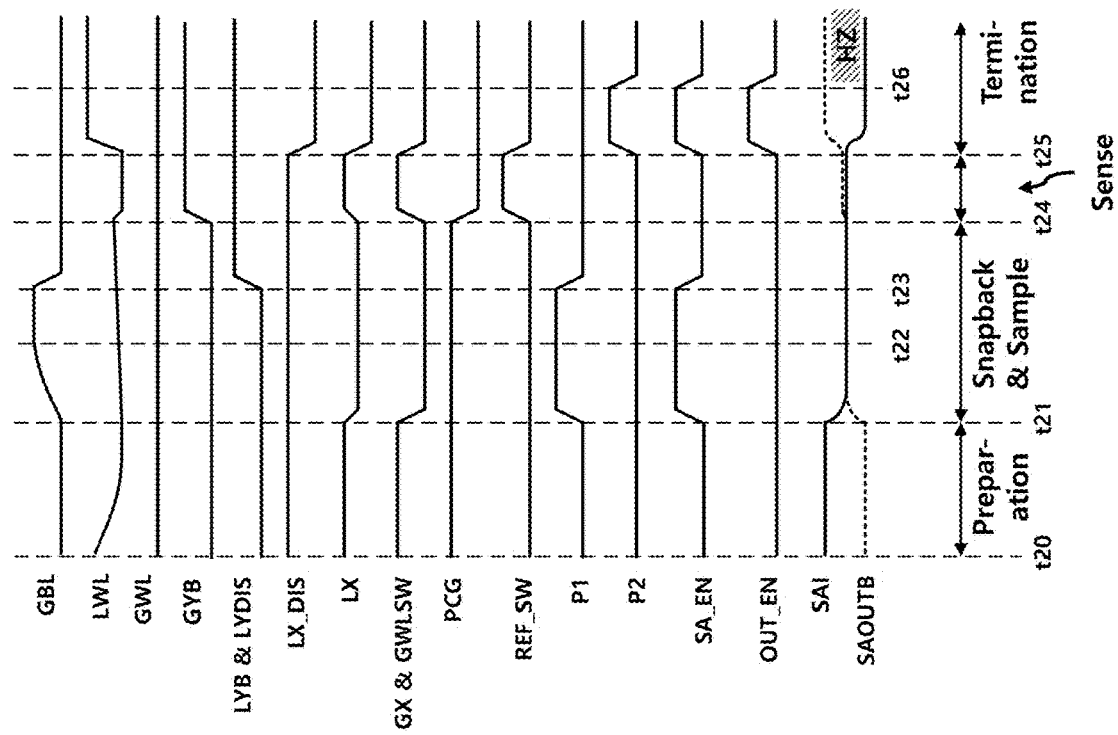

FIGS. 9 and 10 illustrates operations of a control circuit (e.g., the control circuit 100 shown in FIG. 2) that includes a sense amplifier (e.g., the sense amplifier 500-2 of FIG. 6) according to embodiments.

In the timing diagrams of FIGS. 9 and 10, the high level and the low level follow the voltage domain rule described with reference to FIG. 3.

For example, a first low level corresponds to the ground voltage GND and a first high level corresponds to the power supply voltage VDD for the voltage of the global bitline GBL, while a second low level corresponds to the negative voltage VBBRD and a second high level corresponds to the ground voltage GND for the voltage of the global wordline GWL.

FIG. 9 illustrates an operation of a control circuit (e.g., the control circuit 100 of FIG. 2) including a memory cell (e.g., the memory cell 11 in FIG. 3) is programmed to a first state (e.g., a set state or a crystalline state) according to an embodiment.

The section (or a first time interval) between a first time t20 and a second time t21 is referred to as a preparation stage.

In the preparation stage, the selected memory cell 11 is connected with the global bitline GBL and the global wordline GWL before initiating a read operation.

In the preparation stage, the voltage of the global bitline GBL is initialized to a first level (e.g., a low level).

In the preparation stage, the bitline control circuit 110 sets each of the global bitline control signal GYB and the local bitline control signal LYB to a low level and the wordline control circuit 120 sets each of the local wordline control signal LX and the global wordline control signal GX to a second level (e.g., a high level).

Accordingly, a current path is formed between the global bitline GBL and the global wordline GWL via the selected memory cell 11.

The bitline control circuit 110 sets the bitline discharge control signal LYDIS to a low level and the wordline control circuit 120 sets the wordline discharge control signal LXDIS to a high level, so that the bitline discharge switch 230 and the wordline discharge switch 330 are turned off.

The bitline control circuit 110 and the wordline control circuit 120 turn off the remaining bitline discharge switches and wordline discharge switches corresponding to unselected memory cells, so that both nodes of each of the unselected memory cells can be maintained at a ground voltage GND.

In the preparation stage, the sense amplifier control circuit 130 sets each of the control signals GWL_SW and PCG to a high level and sets each of the control signals SA_EN, REF_SW, P1, P2, and OUT_EN to a low level.

As a result, the switches 531 and 532 are turned on to that the global wordline GWL is initialized to the negative voltage VBBRD.

The voltage of the local wordline LWL is initialized to the ground voltage due to the wordline WL initialized to the ground voltage. The voltage of the local wordline LWL is gradually pulled down to the negative voltage VBBRD due the global wordline GWL initialized to the negative voltage VBBRD.

The first and second precharge switches 522 and 532 are turned on in the sense amplifier 500-2 of FIG. 6 and the voltages of the reference signal output node N1 and the signal output node N2 are initialized to the negative voltage VBBRD.

The voltages of the signal input node SN and the reference signal input node RSN of the sense amplifier 500-2 of FIG. 6 may vary in the preparation stage.

For example, in the embodiment of FIG. 9, the voltage of the signal input node SN has a high level and the voltage of the reference signal input node RSN has a low level.

As described above, in the preparation stage, the voltages of the global wordline GWL and the local wordline LWL are lowered to the negative voltage VBBRD to prepare for the read operation.

The section (or a second time interval) between the second time t21 and a fifth time t24 is referred to as a snapback and sample stage.

At the second time t21, the wordline control circuit 120 controls the local bitline control signal LX to have a voltage between a high level and a low level and the global wordline control signal GX and controls the control signal GWL_SW to be at a low level.

Accordingly, the local wordline LWL is separated from the global wordline GWL while the voltage of the local wordline LWL is the negative voltage VBBRD, and the global wordline GWL is separated from the sense amplifier 500-2 while the voltage of the local wordline LWL is the negative voltage VBBRD.

At this time, an on-resistance value of the local wordline switch 320 has a larger value than that of the local wordline switch 320 in the fully turned-on state.

In the second time interval, the bitline control circuit 110 controls the bitline driver 400 to gradually increase the voltage of the global bitline GBL.

A section between the second time t21 and a third time t22 corresponds to a section in which a cell current increases along a first given path (e.g., the lines (2) and (3) of FIG. 1). The third time t22 corresponds to a point when the cell current starts to increase along a second given path (e.g., the line (4) of FIG. 1).

As a result, discontinuity of the cell current occurs at the third time t22, and thus the voltage of the global bitline GBL is discontinuously decreased and the voltage of the local wordline LWL is discontinuously increased.

Thereafter, when the voltage of the global bitline GBL increases, the voltage of the local wordline LWL gradually increases and saturates to the ground voltage.

At a fourth time t23, the bitline control circuit 110 controls the bitline driver 400 to drive the voltage of the global bitline GBL to a low level, for example, the ground voltage GND.

The control signals SA_EN and P1 each are set to a high level between the second time t21 and a fourth time t23, and the voltages of the signal input node SN and the reference signal input node RSN are initialized to a value between a high level and a low level.

For example, when the control signals SA_EN and P1 each are at a high level, the input and the output of the first inverter 511 are connected to each other, and the input and the output of the second inverter 512 are connected to each other. The input voltage and output voltage of an inverter connected in this manner converge to a specific value. This makes the initial voltages of the nodes SN and RSN substantially the same though there is some mismatch between the inverters 511 and 512 because of process variation.

The voltages of the local bitline control signal LYB and the bitline discharge control signal LYDIS each become a high level at a fourth time t23.

As a result, the local bitline LBL is disconnected from the global bitline GBL and the bitline BL is grounded.

This aspect is different from that of the embodiments shown in FIGS. 7 and 8. Specifically, the voltages of the local bitline control signal LYB and the bitline discharge control signal LYDIS according to the embodiment in FIG. 9 are asserted at the fourth time t23, whereas the voltage of the local bitline control signal LYB and the bitline discharge control signal LYDIS according to the embodiments in FIGS. 7 and 8 are asserted at the fifth time t14.

At the fourth time t23, the control signals P1 and SA_EN each become a low level, so that the signal input node SN and the reference signal input node RSN become a floating state to maintain the existing voltage.

As described above, in the snapback and sample stage, the voltage of the local wordline LWL is set according to the state of the memory cell 11.

The voltage of the local wordline LWL is set to a high level when the memory cell 11 is in the set state as shown in FIG. 9. The voltage of the local wordline LWL is set to a low level when the memory cell 11 is in the reset state as shown in FIG. 10.

The section (or a third time interval) between a fifth time t24 and a sixth time t25 is referred to as a sensing stage where the voltage of the local wordline LWL is provided to the sense amplifier 500-2.

At the fifth time t24, the global bitline control signal GYB is controlled to a high level.

At the fifth time t24, the local wordline control signal LX and the global wordline control signal GX each are controlled to a high level.

Since the voltage of the global wordline GWL is at a low level, for example, the negative voltage VBBRD, and the voltage of the local wordline LWL is at a high level, for example, the ground voltage GND, the voltage of the local wordline LWL decreases and the voltage of the global wordline GWL increases after the fifth time t24.

For example, the increase in the voltage of the global wordline GWL is smaller than the decrease in the voltage of the local wordline LWL due to the difference between the parasitic capacitance of the local wordline LWL and the parasitic capacitance of the global wordline GWL.

The control signals GWL_SW and REF_SW provided to the sense amplifier 500-2 each are controlled to be have a high level, and the control signals PCG, SA_EN, P1, and P2 each are controlled to have a low level.

The voltage of the reference signal input node RSN is increased by the reference voltage VREF and the voltage charged in the first coupling capacitor 541. The voltage of the signal input node SN is increased by the voltage of the global wordline GWL and the voltage charged in the second coupling capacitor 542.

For example, the reference voltage VREF has a given value between the negative voltage VBBRD and the voltage of the global wordline GWL.

Accordingly, a slight difference occurs between the voltage SAI at the signal input node SN and the voltage SAOUTB at the reference signal input node RSN of the signal amplification circuit 510 exists in the third time interval between the fifth time t24 and a sixth time t25.

The section (or a fourth time interval) after the sixth time t25 is referred to as a termination stage.

At the sixth time t25, the local bitline control signal LX, the global bitline control signal GX, and the wordline discharge control signal LXDIS each are controlled to be at a low level.

The control signals GWL_SW and REF_SW each are also controlled to be at a low level.

Therefore, the memory cell 11 is separated from the local wordline LWL and the voltage of the wordline WL is set to the ground voltage.

Also, the local wordline LWL is separated from the global wordline GWL, and the global wordline GWL is separated from the sense amplifier 500-2.

The control signals SA_EN, OUT_EN, and P2 each are set to a high level and the control signal P1 is set to a low level at a section between the sixth time t25 and a seventh time t26 so that the first and second inverters 511 and 512 that function as a latch in the sense amplifier 500-2 operate, thereby amplifying a voltage difference between the signal input node SN and the reference signal input node RSN. The third and fourth inverters 513 and 514 output the amplified signal.

When the control signal OUT_EN is set to a low level at the seventh time t26, the output of the sense amplifier 500-2 indicates a high impedance state HZ.

FIG. 10 illustrates an operation of a control circuit (e.g., the control circuit 100 of FIG. 2) including a memory cell (e.g., the memory cell 11 in FIG. 3) is programmed to a second state (e.g., the reset state or the amorphous state) according to an embodiment.

The snapback does not occur in the embodiment shown in FIG. 10.

Accordingly, even if the voltage of the global bitline GBL is increased between the second time t21 and the third time t22, the current flowing through the memory cell 11 increases slowly along a given path (e.g., lines (2) and (4) of FIG. 1).

As a result, the voltage of the local wordline LWL also increases slowly in the second time interval between the second time t21 and the fifth time t24.

The voltage of the global wordline GWL does not substantially rise and the voltage of the local wordline LWL decreases to a voltage substantially equal to the negative voltage VBBRD after the local wordline LWL and the global wordline GWL are connected at the fifth time t24.

At this time, the voltage of the reference voltage VREF becomes higher than the voltage of the global wordline GWL.

Accordingly, the sense amplifier 500-2 outputs a signal opposite to that in FIG. 9 in a portion of the fourth time interval between the sixth time t25 and the seventh time t26.

In embodiments of the present disclosure, the global wordline GWL is separated (or electrically decoupled) from the local wordline LWL in the snapback and sample stage.

The voltage of the local wordline LWL is adjusted by a transient current generated during redistribution of charges. For example, the transient current is a current that gradually decreases from a peak magnitude that has occurred due to the snapback phenomenon.

The parasitic capacitance seen from a node of the local wordline LWL is reduced because the global wordline GWL is decoupled from the local wordline LWL in the snapback and sample stage.

Because the parasitic capacitance of the local wordline LWL is reduced, the transient current decreases rapidly from the peak magnitude to a given magnitude that is sufficiently low to substantially prevent damage to the memory cell.

Moreover, in embodiments of the present disclosure, the local wordline control signal LX is held at a value between a high level and a low level, rather than maintaining the high level in the snapback and sample stage.

As a result, the resistance between the local wordline LWL and the wordline WL may increase to enhance the attenuation effect. For example, the resistance between the local wordline LWL and the wordline WL includes on-resistance of the local wordline switch 320 in FIG. 3.

Accordingly, after the snapback occurs in the memory cell 11, the peak current can be quickly attenuated to substantially prevent the read disturbance.

As described above, in embodiments of the present disclosure, the transient current is generated in the snapback and sample stage, and a time interval during which the transient current has a magnitude large enough to damage the memory cell 11 due to the snapback phenomenon becomes relatively short.

In embodiments of the present disclosure, the voltage difference of the global wordline GWL generated in the sensing stage according to the state of the memory cell 11 is relatively small. For example, when the voltage of the global wordline GWL is provided to a sense amplifier (e.g., the sense amplifier 500 in FIG. 4) in the sensing stage, a first voltage level of the global wordline GWL when the memory cell 11 is in the set state is slightly higher than a second voltage level of the global wordline GWL when the memory cell 11 is in the reset state. In addition, when the memory cell 11 is in the set state, the first voltage level of the global wordline GWL provided to the sense amplifier 500 in the sensing stage may be smaller than that of a conventional memory device.

Therefore, the sense amplifier 500 may be implemented to detect a relatively small voltage difference, and have characteristics that are robust to process, voltage, and temperature (PVT) variations.

To this end, the sense amplifier 500 according to an embodiment of the present disclosure turns on the control signals GWL_SW and REF_SW not in the snapback and sample stage but in the sensing stage and receives the input signal and the reference signal. As a result, an operation of the sense amplifier 500 may be controlled using the control signals GWL_SW and REF_SW. Moreover, the sense amplifier 500 may include a plurality of inverters that function as a latch to detect a relatively small voltage difference.

In the embodiment shown in FIG. 4, the sense amplifier 500 receives the input signal and the reference signal using the first coupling capacitor 541 and the second coupling capacitor 542.

The initial values of the signal input node SN and the reference signal input node RSN of the signal amplification circuit 510 in the snapback and sample stage are set to values between the ground voltage GND and the negative voltage VBBRD. The voltages of the reference signal output node N1 and the signal output node N2 are initialized to the negative voltage VBBRD and then rise to the reference voltage VREF and the voltage of the global wordline GWL.

At this time, the first coupling capacitor 541 and the second coupling capacitor 542 may substantially block DC signals. It is preferable that the signal voltage SAI of the signal amplification circuit 510 is initialized to a voltage in the middle of the negative voltage VBBRD and the ground voltage GND for a faster sensing operation. The voltage of the global wordline GWL rises from the negative voltage VBBRD and so does the voltage of the signal output node N2. The presence of the coupling capacitor 542 allows DC isolation of the signal input node SN from the signal output node N2 and allows a faster and more reliable operation of the signal amplification circuit 510.

The voltages of the signal input node SN and the reference signal input node RSN are determined differently according to the voltages of the reference voltage VREF and the global wordline GWL.

In embodiments of the present disclosure, a relatively small voltage difference can be amplified by a sense amplifier including an inverter-type latch.

In embodiments of the present disclosure, the voltage of the local wordline LWL is generated in the snapback and sample stage. In the sensing stage, the voltage of the global wordline GWL is generated in accordance with the voltage of the local wordline LWL and then the voltage of the global wordline GWL is transmitted to the sense amplifier 500.

Thus, by separating the sensing stage from the snapback and sample stage, influence of noise can be reduced.

Figure 11:
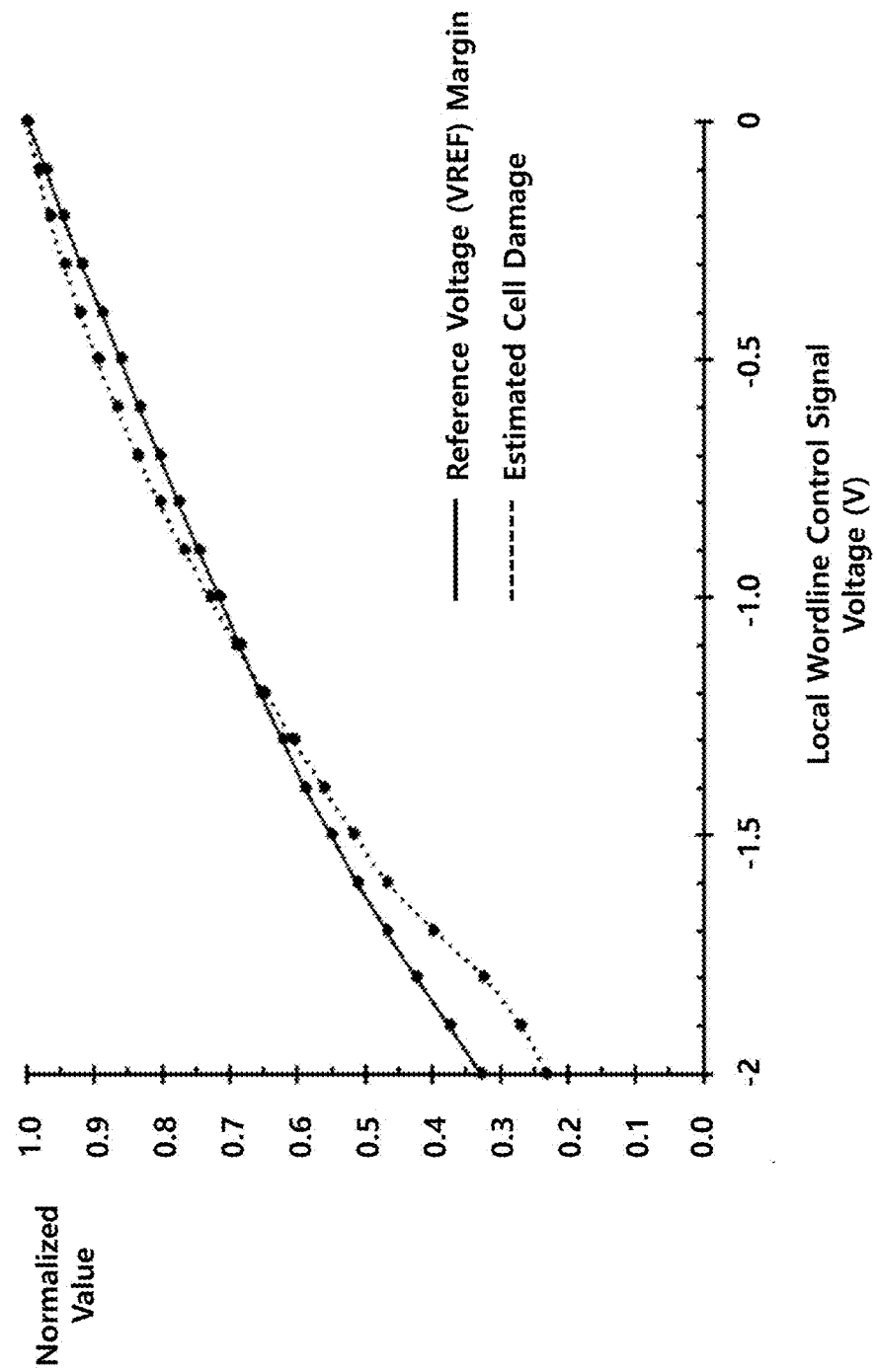
FIG. 11 illustrates estimated cell damage to a memory cell and a margin of a reference voltage as a function of a local wordline control signal according to an embodiment of the present disclosure.

FIG. 11 illustrates damage to a memory cell and a margin of the reference voltage VREF of a sense amplifier as a function of a voltage of the local wordline control signal LX, according to an embodiment of the present disclosure. For example, a total amount of power consumption at the memory cell may indicate the damage to the memory cell.

Values of the damage to the memory cell and the voltage of the margin of the reference voltage VREF are normalized based on respective values of the damage to the memory cell and the voltage of the margin of the reference voltage VREF at the maximum voltage of the local wordline control signal LX.

As described above, the higher the voltage of the local wordline control signal LX, the larger current flows in the snapback and sample stage when the memory cell is in the set state.

As a result, degree of the memory cell damage and the voltage of the local wordline LWL becomes higher as the voltage of the local wordline control signal LX increases.

The higher the voltage of the local wordline LWL when the memory cell is in the set state, the higher the voltage of the global wordline GWL becomes. Therefore, the margin of the reference voltage VREF of the sense amplifier 500 increases as the voltage of the local wordline LWL when the memory cell in the set state becomes higher.

The graph of FIG. 11 represents this phenomenon.

The level of the local wordline control signal LX can be selected in consideration of a given margin (e.g., a predetermined margin) of the reference voltage VREF of the sense amplifier 500 and the degree of the memory cell damage with reference to the graph of FIG. 11

Although various embodiments have been described for illustrative purposes, various changes and modifications may be possible.

What is claimed is:

1. A semiconductor memory device comprising:
 a memory cell array including one or more memory cells each coupled between a wordline and a bitline;
 a sense amplifier configured to directly receive a voltage of a global wordline and amplify the voltage of the global wordline during a sensing stage of a read operation;
 a wordline decoder including a plurality of wordline switches coupling the wordline and the global wordline; and
 a control circuit configured to control the wordline decoder and the sense amplifier,
 wherein the plurality of wordline switches include:
  a local wordline switch coupling the wordline and a local wordline; and
  a global wordline switch coupling the local wordline and the global wordline, and
 wherein the control circuit generates a global wordline control signal to couple or decouple the local wordline and the global wordline and generates a first control signal to transfer the voltage of the global wordline to the sense amplifier, a voltage of the local wordline being adjusted according to a state of a memory cell selected among the memory cells during a snapback and sample stage before the sensing stage of the read operation,
 wherein the global wordline is decoupled from the local wordline during the snapback and sample stage, and
 wherein the global wordline is coupled with the local wordline and the voltage of the global wordline is provided to the sense amplifier during the sensing stage.

2. The semiconductor memory device of claim 1, wherein the wordline decoder further comprises a wordline discharge switch configured to discharge the wordline.

3. The semiconductor memory device of claim 1, further comprising:
 a bitline driver configured to drive a global bitline; and
 a bitline decoder including a plurality of bitline switches coupling the global bitline and the bitline,
 wherein the plurality of bitline switches includes:
  a local bitline switch coupling the bitline to a local bitline; and
  a global bitline switch coupling the local bitline to the global bitline.

4. The semiconductor memory device of claim 3, wherein the bitline decoder further includes a bitline discharge switch configured to discharge the bitline.

5. The semiconductor memory device of claim 3, wherein the control circuit is further configured to control the bitline driver and to turn on the local bitline switch, the global bit line switch, the local wordline switch, and the global wordline switch to set each of a voltage of the global bitline and the voltage of the local wordline to a specific level.

6. The semiconductor memory device of claim 5, wherein the control circuit is further configured to adjust the voltage of the local wordline by changing on-resistance of the local wordline switch using the local wordline control signal.

7. The semiconductor memory device of claim 6, wherein the control circuit turns off the global wordline switch and increases the voltage of the global bitline.

8. The semiconductor memory device of claim 1, wherein the sense amplifier includes:
 a signal input circuit configured to couple the global wordline to a signal output node according to the first control signal; and
 a signal amplification circuit including a signal input node coupled with the signal output node and configured to output an amplified signal in response to a signal at the signal input node.

9. The semiconductor memory device of claim 8, wherein the signal input circuit further comprises a precharge switch configured to precharge the signal output node.

10. The semiconductor memory device of claim 8, wherein the signal input circuit comprises:
 a precharge switch configured to precharge the global wordline; and
 a signal output switch configured to couple the global wordline switch and the signal output node.

11. The semiconductor memory device of claim 10, wherein the signal input circuit further comprises:
 a capacitor coupled with the signal output switch at a common node; and
 a global wordline connection switch configured to couple the global wordline to the common node.

12. The semiconductor memory device of claim 8, wherein the sense amplifier further comprises a reference signal input circuit including a reference voltage output switch providing a reference voltage to a reference signal output node according to a second control signal, and
 wherein the signal amplification circuit includes a reference signal input node coupled with the reference signal output node and outputs the amplified signal according to a voltage difference between the signal input node and the reference signal input node.

13. The semiconductor memory device of claim 12, wherein the reference signal input circuit further includes a precharge switch precharging the reference signal output node.

14. The semiconductor memory device of claim 12, wherein the sense amplifier further comprises a first coupling capacitor coupling the signal output node and the signal input node and a second coupling capacitor coupling the reference signal output node and the reference signal input node.

15. The semiconductor memory device of claim 8, wherein the signal amplification circuit includes a first inverter and a second inverter functioning as a latch, the first and second inverters being coupled between the signal input node and a reference signal input node.

16. The semiconductor memory device of claim 15, wherein the signal amplification circuit further includes an initialization switch coupling the signal input node and the reference signal input node.

17. The semiconductor memory device of claim 15, wherein the signal amplification circuit further comprises:
- a first switch coupling an input node and an output node of the first inverter;
- a second switch coupling an input node and an output node of the second inverter;
- a third switch coupling the output node of the first inverter and the signal input node; and
- a fourth switch coupling the output node of the second inverter and the reference signal input node.

18. The semiconductor memory device of claim 16, wherein the signal amplification circuit further comprises:
- a third inverter inverting a signal at the reference signal input node; and
- a fourth inverter inverting a signal at the signal input node.

19. The semiconductor memory device of claim 1, wherein the sense amplifier includes:
- a signal input circuit configured to couple the global wordline to a signal output node according to the first control signal to provide the voltage of the global wordline to the signal output node.

* * * * *